(12) United States Patent
Shue et al.

(10) Patent No.: US 6,620,725 B1
(45) Date of Patent: Sep. 16, 2003

(54) REDUCTION OF CU LINE DAMAGE BY TWO-STEP CMP

(75) Inventors: Shau-Lin Shue, Hsin-Chu (TW); Ming-Hsing Tsai, Taipei (TW); Wen-Jye Tsai, Tainan (TW); Ying-Ho Chen, Taipei (TW); Tsu Shih, Hsin-Chu (TW); Jih-Churng Twu, Chung-Ho (TW); Syun-Ming Jang, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/395,287

(22) Filed: Sep. 13, 1999

(51) Int. Cl.⁷ ........................................... H01L 21/4763
(52) U.S. Cl. ...................... 438/633; 438/672; 438/687; 438/692
(58) Field of Search ................................ 438/618, 622, 438/631, 633, 637, 666, 667, 668, 669, 672, 687, 691, 692, 693

(56) References Cited

U.S. PATENT DOCUMENTS

| | | | |
|---|---|---|---|
| 4,450,652 A | | 5/1984 | Walsh ........................ 51/131.4 |
| 5,104,828 A | | 4/1992 | Morimoto et al. .......... 437/225 |
| 5,300,155 A | | 4/1994 | Sandhu et al. ................ 148/33 |
| 5,380,546 A | | 1/1995 | Krishnan et al. ......... 427/126.1 |
| 5,584,146 A | | 12/1996 | Shamouillan et al. .......... 51/293 |
| 5,735,731 A | * | 4/1998 | Lee ............................. 451/143 |
| 5,770,095 A | | 6/1998 | Sasaki et al. .................. 216/38 |
| 5,840,629 A | * | 11/1998 | Carpio ........................ 438/692 |
| 5,913,712 A | * | 6/1999 | Molinar ........................ 451/41 |
| 5,940,956 A | * | 8/1999 | Jordan ..................... 29/603.16 |
| 5,985,748 A | * | 11/1999 | Watts et al. ................. 438/622 |
| 6,001,730 A | * | 12/1999 | Farkas et al. .................. 106/11 |
| 6,051,496 A | * | 4/2000 | Jang ........................... 438/687 |
| 6,110,820 A | * | 8/2000 | Sandhu et al. .............. 438/633 |
| 6,117,775 A | * | 9/2000 | Kondo et al. ................ 438/690 |
| 6,143,656 A | * | 11/2000 | Yang et al. .................. 438/687 |
| 6,184,141 B1 | * | 2/2001 | Avanzino et al. ........... 438/692 |
| 6,232,231 B1 | * | 5/2001 | Sethuraman et al. ......... 438/691 |
| 6,367,146 B1 | * | 4/2002 | Han et al. ................. 29/603.15 |

* cited by examiner

*Primary Examiner*—Amir Zarabian
*Assistant Examiner*—Jeff Vockrodt
(74) *Attorney, Agent, or Firm*—George O. Saile; Stephen B. Ackerman

(57) ABSTRACT

A process for performing CMP in two steps is described. After trenches have been formed and over-filled with copper, in a first embodiment of the invention a hard pad is used initially to remove most of the copper until a point is reached where dishing effects would begin to appear. A soft pad is then substituted and CMP continued until all copper has been removed, except in the trenches. In a second embodiment, CMP is initiated using a pad to which high-pressure is applied and which rotates relatively slowly. As before, this combination is used until the point is reached where dishing effects would begin to appear. Then, relatively low pressure in combination with relatively high rotational speed is used until all copper has been removed, except in the trenches. Both of these embodiments result in trenches which are just-filled with copper, with little or no dishing effects, and with all traces of copper removed everywhere except in the trenches themselves.

10 Claims, 3 Drawing Sheets

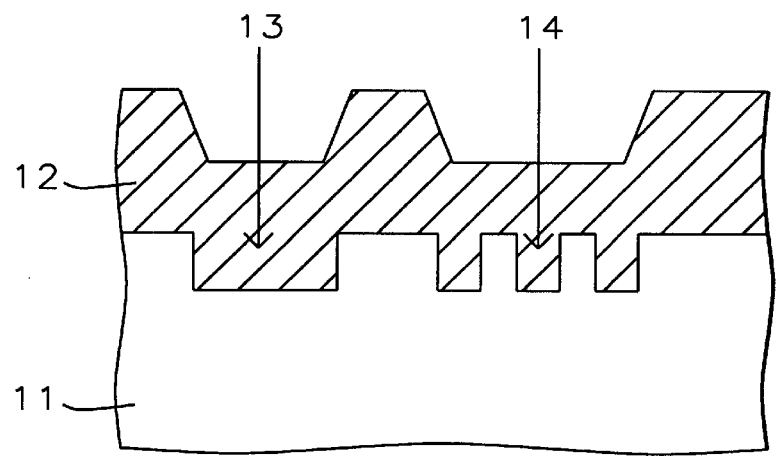
FIG. 1 — Prior Art
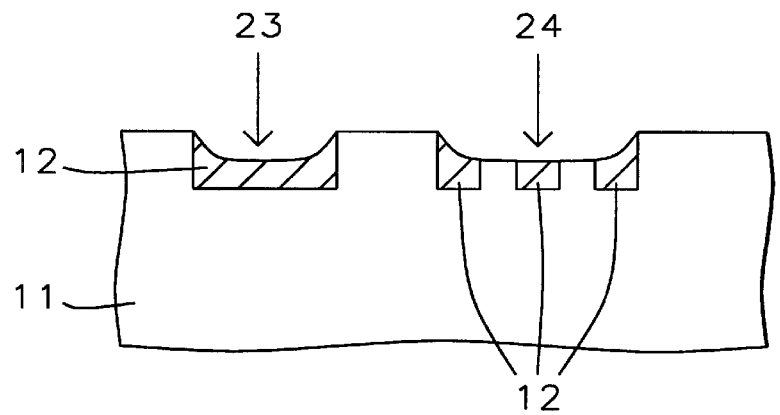
FIG. 2 — Prior Art
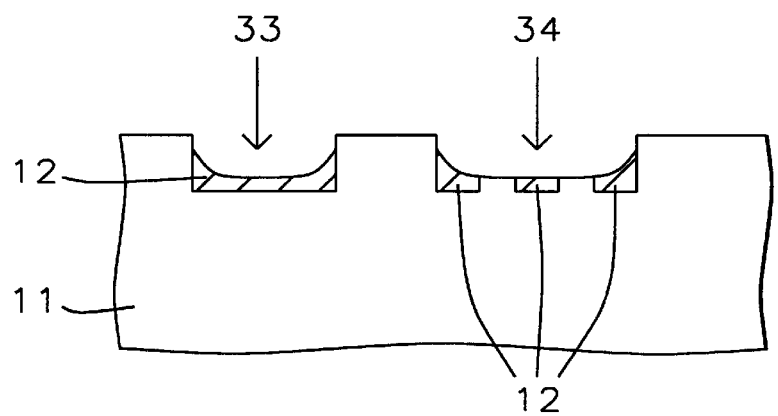
FIG. 3 — Prior Art

REDUCTION OF CU LINE DAMAGE BY TWO-STEP CMP

FIELD OF THE INVENTION

The invention relates to the general field of integrated circuit manufacture with particular reference to trench filling by means of CMP.

BACKGROUND OF THE INVENTION

From the outset, chemical etching has been used, in both liquid and gaseous environments, for the removal of material during the processing of semiconductor integrated circuits. Removal of material by mechanical means, namely polishing with a slurry of abrasive particles, was developed elsewhere, notably the optical industry, but found a place in the semiconductor industry in the early days for the polishing of silicon wafers. It was soon found, however, that semiconductor surfaces had to be free of mechanical damage, however slight, if they were to have satisfactory electrical properties.

To overcome the problems associated with purely mechanical polishing, the process called chemical mechanical polishing (CMP) was developed. As the name implies, surfaces subjected to CMP are exposed to both chemical and mechanical polishing simultaneously. What CMP achieved was the ability to remove material along an approximately planar etch front at reasonable rates without leaving behind a damaged surface. This made CMP highly attractive as a means for planarizing a surface and it has been used for this purpose by the semiconductor industry for some years.

The removal rate R of material from a surface undergoing CMP can be represented by equation 1 as follows:

$$R = k1PV + k2V + k3 \quad (1)$$

where

P is the pressure between the slurry-bearing platten and the wafer,

V is the relative velocity between the surface and the platten, k1 is a constant whose value depends on the various parameters associated with the mechanical component (slurry particle size, density, hardness, etc.), k2 is a constant associated with hydrodynamic aspects of the system such as viscosity, surface tension, etc., and k3 is a constant whose value depends on the various parameters associated with the chemical component (etchant concentration, temperature, refresh rate, etc.). Included in k3 would be the effects of any inhibitor that has been added to the etchant. Inhibitors form a self-limiting layer of etch-resistant material on the surface that is being etched, thereby halting the chemical attack until this limiting layer has been removed through mechanical means.

Although, as already implied, CMP has enjoyed great success as a planarization technique, it is not without its problems. A particular example of this is when a surface comprising a mix of hard and soft materials needs to be planarized. This situation arises during the formation of damascene wiring where lines are buried within a dielectric surface rather than lying on top of it.

Referring now to FIG. 1, we show a schematic cross-section of a dielectric layer 11 (comprising the top-most layer of an integrated circuit wafer) in whose upper surface several trenches, such as 13 and 14, have previously been formed. Copper layer 12 has been deposited over 11 in a sufficient quantity to ensure that all the trenches have been over-filled with the copper. CMP is now to be used to remove all copper that is not in the trenches, i.e. leaving the trenches just-filled while at the same time removing all traces of copper from everywhere else on layer 11's upper surface.

A typical result obtained using CMP technology of the prior art is illustrated in FIG. 2. At the process point where the surface of 11 appears to be free of copper, it is found that considerable dishing of the trenches has occurred at 23 and 24 so that, instead of being just-filled, the trenches are under-filled. This is a consequence of the fact that, as the surface of 11 was being approached, the polish rate above the hard dielectric became significantly slower relative to the polish rates over areas where copper extended for a significant depth.

In practice it is often necessary to continue CMP beyond the stage illustrated in FIG. 2 because of residual copper traces still present on surfaces removed from the trenches. The result is that dishing becomes even more pronounced, as illustrated in FIG. 3, where trenches 33 and 34 are seen to be under-filled to the point of having almost no copper in them.

The present invention teaches how damascene wiring may be formed in which the trenches are just-filled with copper while at the same time removing all traces of copper everywhere else. A routine search of the prior art was performed but no references that teach the solution provided by the present invention were found. Several references of interest were, however, encountered. For example, Krishnan et al. (U.S. Pat. No. 5,380,546) allow dishing to occur but then they deposit a second metal layer which, in addition to being a barrier material, has polishing properties similar to the surrounding silicon oxide, so proper planarization is now possible—i.e. the locations where dishing had occurred become backfilled with a barrier layer material.

Sasaki et al. (U.S. Pat. No. 5,770,095) describe a two-step etching process:

(a) purely mechanical, which is fast and planar but which causes gross surface damage, followed by (b) conventional CMP, which is slower but which removes surface damage.

They also do CMP with, and without, an inhibitor, and CMP at room temperature followed by CMP at low temperature.

Sandhu et al. (U.S. Pat. No. 5,300,155) adjust the chemical contribution to the total CMP process by varying the temperature, first at room temperature and then at a lower temperature.

Walsh (U.S. Pat. No. 4,450,652) controls the temperature of a conventional (not CMP) system by varying the pressure on the wafers. This causes the temperature to change, thus allowing a closed loop to be used to keep the temperature constant through adjustment of the pressure.

Shamouillan et al. (U.S. Pat. No. 5,584,146) improve polishing uniformity by including conduits in the polishing pad for more efficient removal of the slurry.

Morimoto et al. (U.S. Pat. No. 5,104,828) find that uniformity during conventional polishing (not CMP) is improved by polishing at temperatures that are substantially below room temperature.

SUMMARY OF THE INVENTION

It has been an object of the present invention to provide a process for performing chemical mechanical polishing without the introduction of dishing.

Another object of the invention has been that said process be suitable for just-filling, with copper, trenches etched in the surface of a silicon wafer.

A further object of the invention has been that said process be fully compatible with existing integrated circuit manufacturing techniques.

These objects have been achieved by performing CMP as a two-step process. After trenches have been formed over-filled with copper, in a first embodiment of the invention a pad having high compressibility is used initially to remove most of the copper until a point is reached where dishing effects would begin to appear. A pad having low compressibility is then substituted and CMP continued until all copper has been removed, except in the trenches. In a second embodiment, CMP is initiated using a pad to which high-pressure is applied and which rotates relatively slowly. As before, this combination is used until the point is reached where dishing effects would begin to appear. Then, relatively low pressure in combination with relatively high rotational speed is used until all copper has been removed, except in the trenches. Both of these embodiments result in trenches which are just filled with copper, with little or no dishing effects, and with all traces of copper removed everywhere except in the trenches themselves.

BRIEF DESCRIPTION OF THE DRAWINGS

FIG. 1 is a cross-section of a silicon wafer in whose upper surface trenches have been etched and then over-filled with copper.

FIGS. 2 and 3 illustrate how dishing, in some cases severe, can occur when planarization is performed using techniques of the prior art.

DESCRIPTION OF THE PREFERRED EMBODIMENTS

The process of the present invention begins with the provision of a silicon wafer on whose upper surface (such as layer 11 in FIG. 1) multiple trenches such as 13 and 14 have been formed. These trenches typically have a depth that is between about 0.3 and 15 microns and may be of various widths, anywhere from about 0.1 to about 10 microns. Copper layer 12 is then deposited over 11 to a sufficient thickness (typically between about 0.2 and 15 microns) to ensure that the trenches become over-filled.

At this stage of the process, the present invention provides two different embodiments which achieve the same desired end result. For both embodiments, the temperature remained constant at between about 15 and 35° C.

First Embodiment

Figure 4:
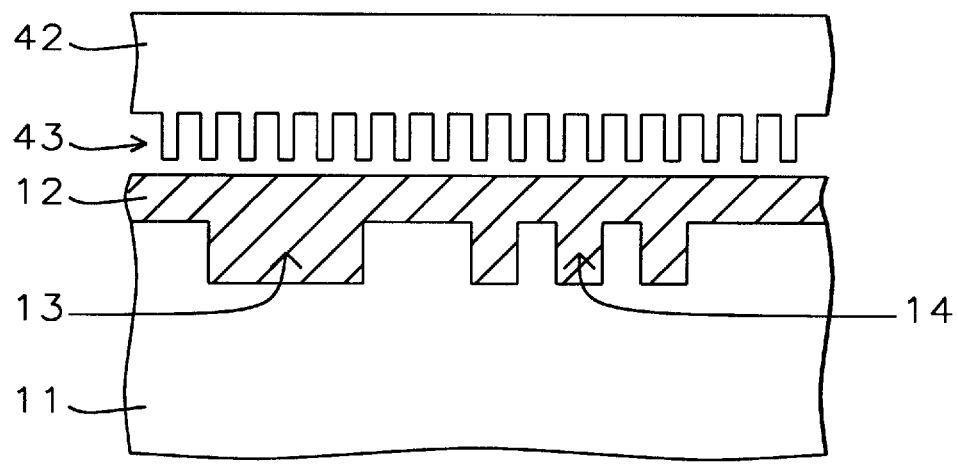
FIG. 4 illustrates performing CMP on a copper layer using a hard pad.

Referring to FIG. 4, with trenches, such 13 and 14, overfilled with copper layer 12, CMP was initiated. A constant rotational speed for the polishing pad between about 15 and 45 RPM was used throughout this embodiment, using polishing pad 42. An important feature of pad 42 is that it is hard and its compressibility is between about 5 and 27%. In FIG. 4 this hardness aspect is symbolized by providing the pad with (symbolic) rigid bristles.

A second important feature that is part of the process at this stage is that no inhibitor is used. This allows material to be very rapidly removed (between about 3,000 and 5,000 Angstroms/minute) at this stage, representing an important cost-saving.

After the removal of an amount of material whose thickness approximates the difference between the amount deposited and the depth of the trench, the trenches are still over-filled but the remaining thickness of copper is such that dishing has not yet commenced.

Figure 5:
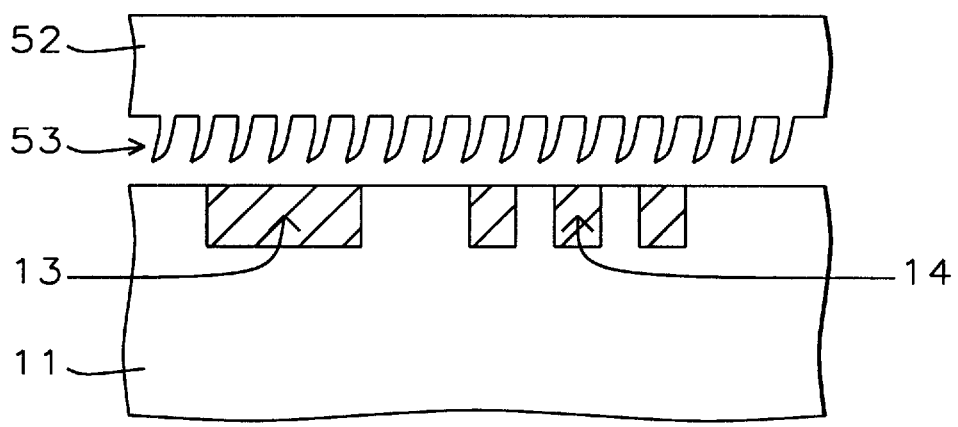
FIG. 5 illustrates performing CMP on a copper layer using a soft pad.

Referring now to FIG. 5, in a key step, hard pad 42 is removed and replaced by soft pad 52 whose compressibility is between about 0.5 and 6%, its softness relative to pad 52 being symbolized by the presence of flexible bristles 53.

Figure 8:
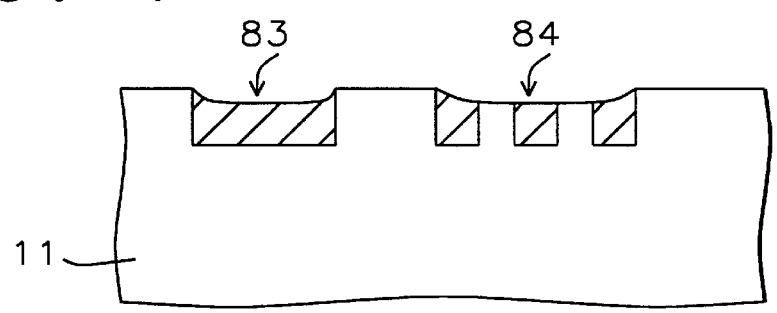
FIG. 8 shows the results of performing CMP according to the teachings of the present invention.

Additionally, an inhibitor such as benzotriazole (BTA) is added to the slurry and CMP is reinitiated so that all remaining copper outside the trenches is removed resulting in the trenches (such as 83 or 84 in FIG. 8) becoming just-filled with copper.

Second Embodiment

Figure 6:
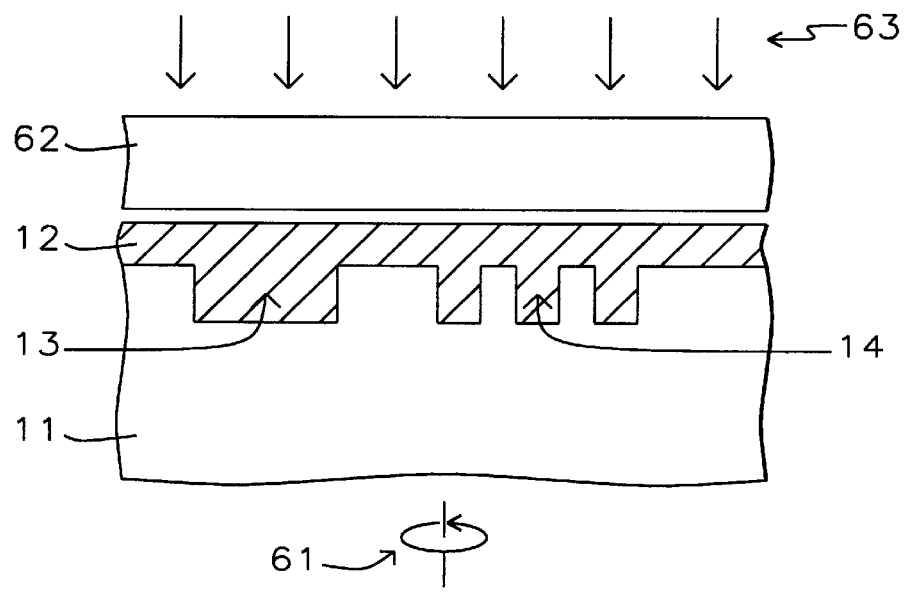
FIG. 6 illustrates performing CMP using a pad under high pressure and low rotational speed.

Referring now to FIG. 6, with the trenches, such 13 and 14, overfilled with copper layer 12, CMP was initiated. Unlike the first embodiment, an inhibitor was used throughout but the rotational speed of the polishing pad was varied. Initially, a relatively low rotational speed, between about 20 and 30 RPM, was used. An important feature of pad 42 is that it is hard and its compressibility is between about 5 and 27%.

At the same time that the low speed was used, the pressure applied to the pad (symbolized by large arrows 63) was made relatively large ( between about 4 and 6 PSI). The high pressure used in conjunction with the low rotation speed, leads to a relatively fast rate of copper removal (typically between about 0.3 and 0.5 microns/minute). After the removal of between about 0.8 and 0.9 microns of copper, the trenches are still over-filled but the remaining thickness of copper (between about 0.1 and 0.2 microns) is such that dishing has not yet commenced.

Figure 7:
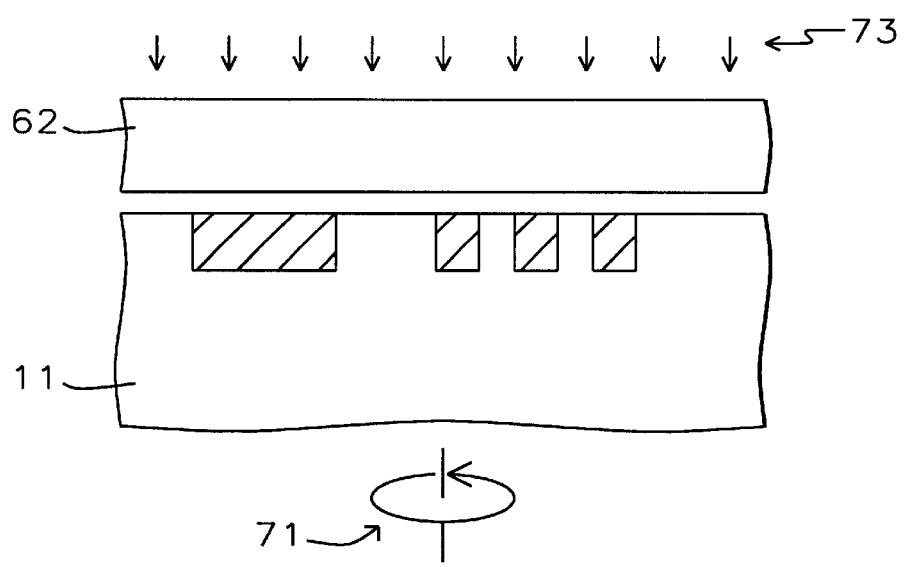
FIG. 7 illustrates performing CMP using a pad under low pressure and high rotational speed.

Referring now to FIG. 7, in a key step, the rotational speed was increased (to between about 50 and 70 RPM) as symbolized by large directional circle 71, while the pressure on pad 62 was decreased (to between about 2 and 4 PSI), as symbolized by small arrows 73. CMP was then continued until all remaining copper outside the trenches was removed, resulting in the trenches (such as 83 or 84 in FIG. 8) becoming just-filled with copper.

While the invention has been particularly shown and described with reference to the preferred embodiments thereof, it will be understood by those skilled in the art that various changes in form and details may be made without departing from the spirit and scope of the invention.

What is claimed is:

1. A process for forming damascene wiring, comprising:

providing a silicon wafer having an upper surface in which multiple trenches have been formed;

depositing a layer of copper on said upper surface whereby said trenches become over-filled;

by means of CMP, using a pad that is applied at a first pressure and that rotates at a first speed, removing an amount of said copper layer;

then, by means of CMP, using a pad that is applied at a second pressure that is lower than said first pressure and that rotates at a second speed which is greater than said first speed, removing all remaining amounts of said copper that lie on said upper surface whereby said trenches become just-filled with copper.

2. The process of claim 1 wherein said layer of copper is deposited to a thickness between about 0.2 and 15 microns.

3. The process of claim 1 wherein the amount of copper removed by the pad that is applied at the first pressure and speed, is between about 0.8 and 0.9 microns.

4. The-process of claim 1 wherein said first pressure is between about 4 and 6 PSI.

5. The process of claim 1 wherein said first speed is between about 20 and 30 RPM.

6. The process of claim 1 wherein said second pressure is between about 2 and 4 PSI.

7. The process of claim 1 wherein said second speed is between about 50 and 70 RPM.

8. The process of claim 1 wherein CMP is performed at a constant temperature that is between about 15 and 35° C.

9. The process of claim 1 wherein the trenches have widths in a range of between about 0.1 and 10 microns.

10. The process of claim 1 wherein the trenches have a depth that is between about 0.3 and 1.5 microns.

* * * * *